United States Patent [19]
Temple

[11] Patent Number: 4,857,977
[45] Date of Patent: Aug. 15, 1989

[54] LATERAL METAL-OXIDE-SEMICONDUCTOR CONTROLLED TRIACS

[75] Inventor: Victor A. K. Temple, Clifton Park, N.Y.

[73] Assignee: General Electric Comapny, Schenectady, N.Y.

[21] Appl. No.: 88,353

[22] Filed: Aug. 24, 1987

[51] Int. Cl.[4] .............................................. H01L 29/78
[52] U.S. Cl. ................................... 357/23.4; 357/23.8; 357/23.14; 357/39; 357/55; 357/86
[58] Field of Search ................... 357/23.4, 23.8, 23.14, 357/39, 86, 55

[56] References Cited

U.S. PATENT DOCUMENTS

| | | | |
|---|---|---|---|
| 4,199,774 | 4/1980 | Plummer | 357/41 |
| 4,574,207 | 3/1986 | Benjamin et al. | 357/86 |
| 4,577,208 | 3/1986 | Schuttene et al. | 357/23.8 |
| 4,612,465 | 9/1986 | Schutten et al. | 357/23.14 |
| 4,622,569 | 11/1986 | Lade et al. | 357/39 |
| 4,672,407 | 6/1987 | Nakagawa et al. | 357/23.4 |
| 4,717,940 | 1/1988 | Shinohe et al. | 357/23.4 |

FOREIGN PATENT DOCUMENTS

| | | | |
|---|---|---|---|
| 56-88363 | 7/1981 | Japan | 357/23.4 |
| 57-153469 | 9/1982 | Japan | 357/23.4 |

OTHER PUBLICATIONS

"Insulated Gate Planar Thyristors: I-Structure and Basic Operation" by Plummer, IEEE Transactions on Electron Devices, vol. Ed-27, No. 2, Feb. 1980, pp. 380-386.

"Insulated Gate Planar Thyristors: II-Quantitative Modeling" by B. W. Scharf and J. D. Plummer, IEEE Transactions on Electron Devices, vol. ED-27, No. 2, Feb. 1980-pp. 387-393.

Primary Examiner—Joseph E. Clawson, Jr.
Attorney, Agent, or Firm—Robert Ochis; James C. Davis, Jr.; Marvin Snyder

[57] ABSTRACT

Lateral MOS controlled gate turn-off triacs with large OFF-Gate-width to emitter-width ratios. In one embodiment an ON channel is provided at one main electrode and an OFF channel is provided at the other. In another embodiment two channels in a series are provided at each main electrode. Current turn-off capacity is increased by serpentine or comb shaped channel regions or by trenches which provide channels along their walls.

24 Claims, 12 Drawing Sheets

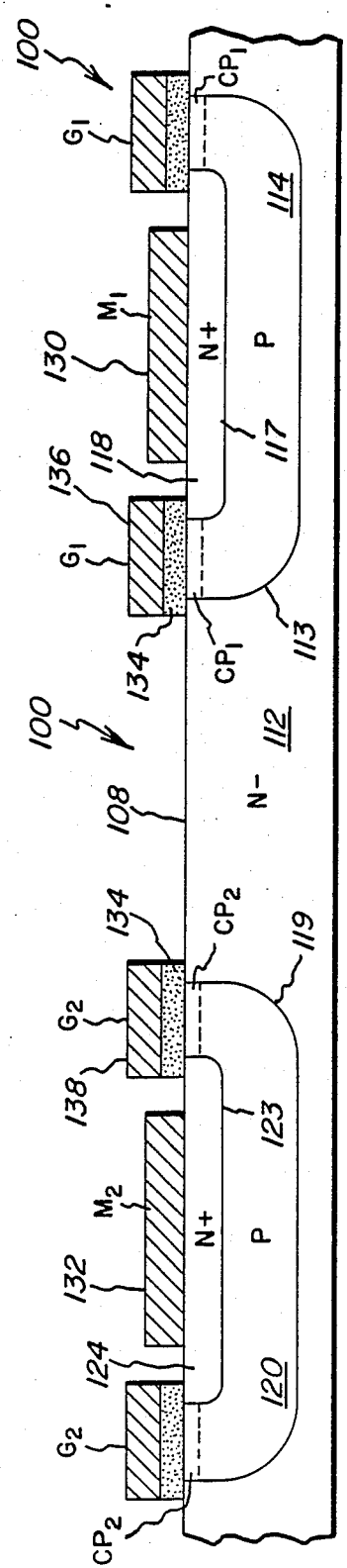
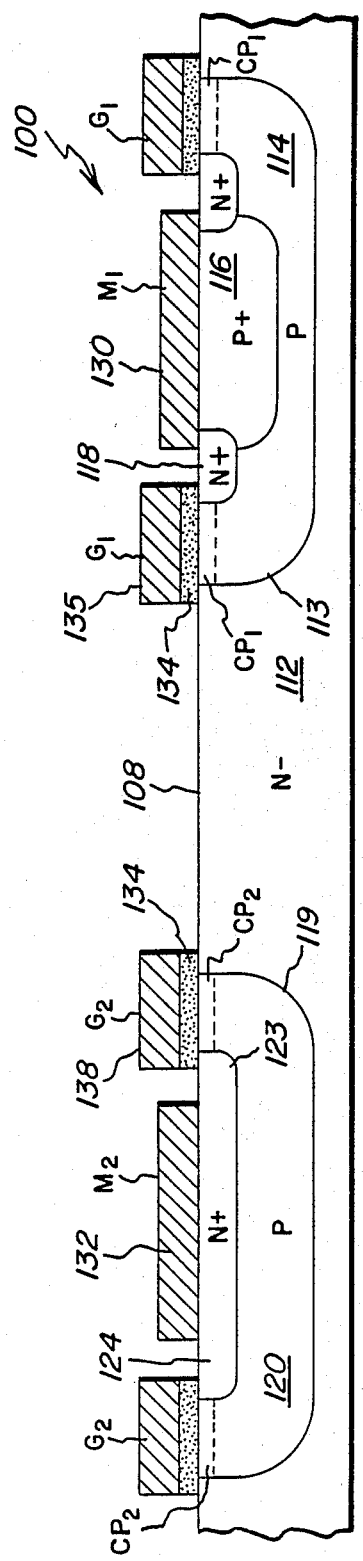

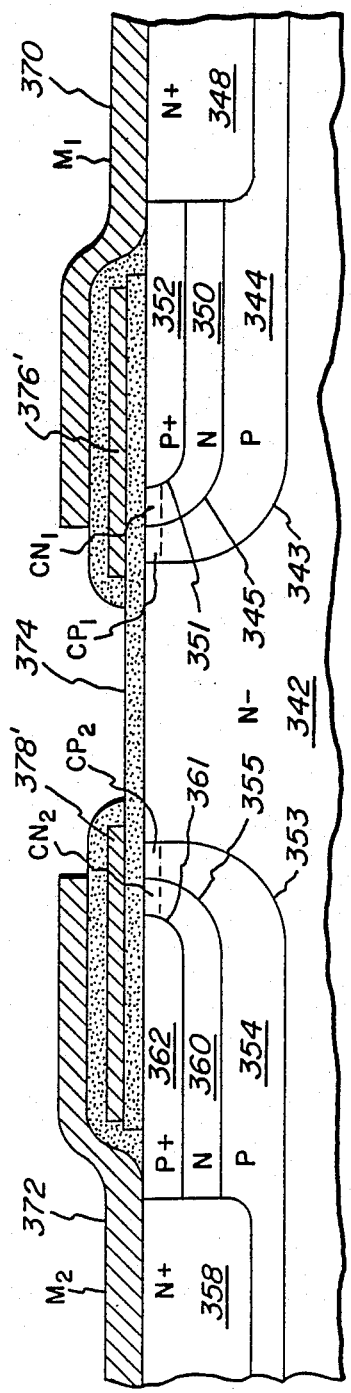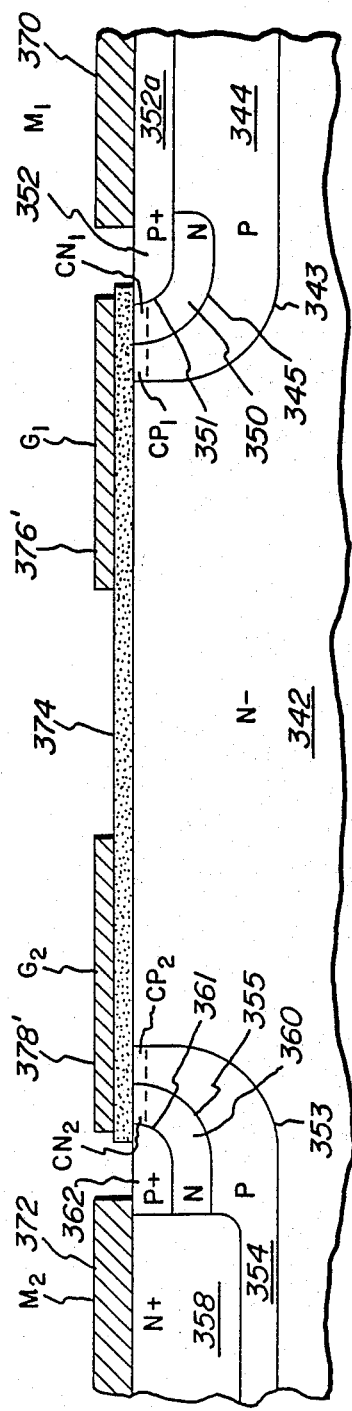
FIG. 12
FIG. 13

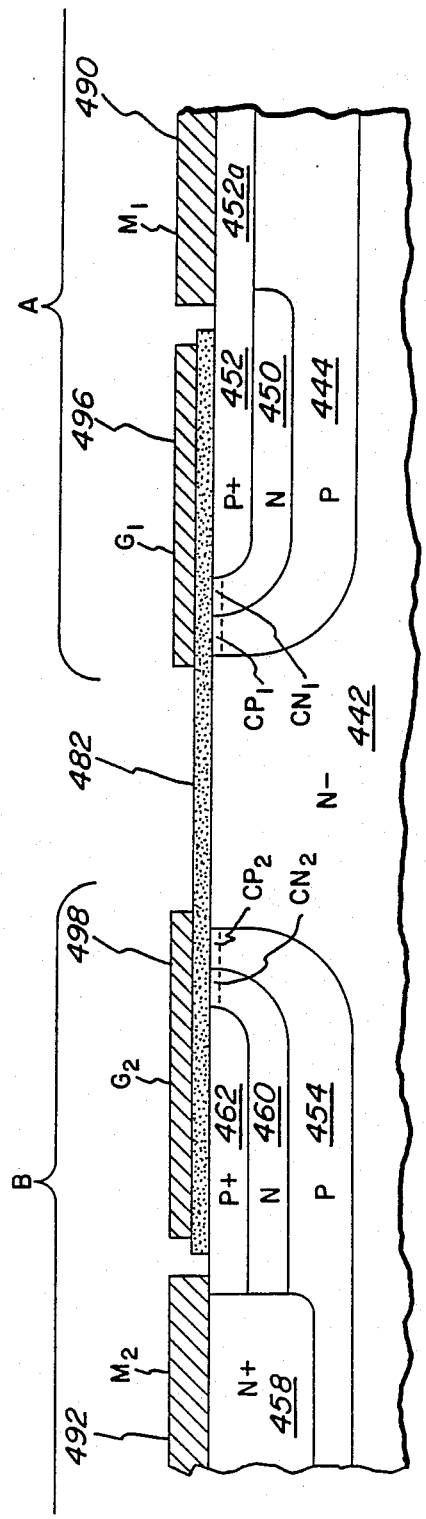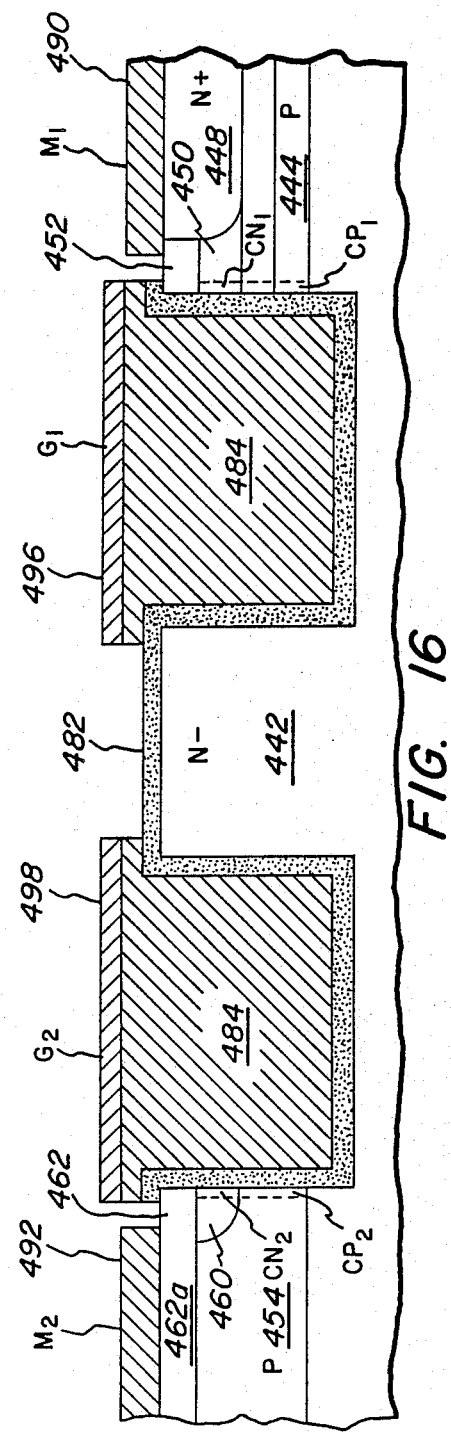

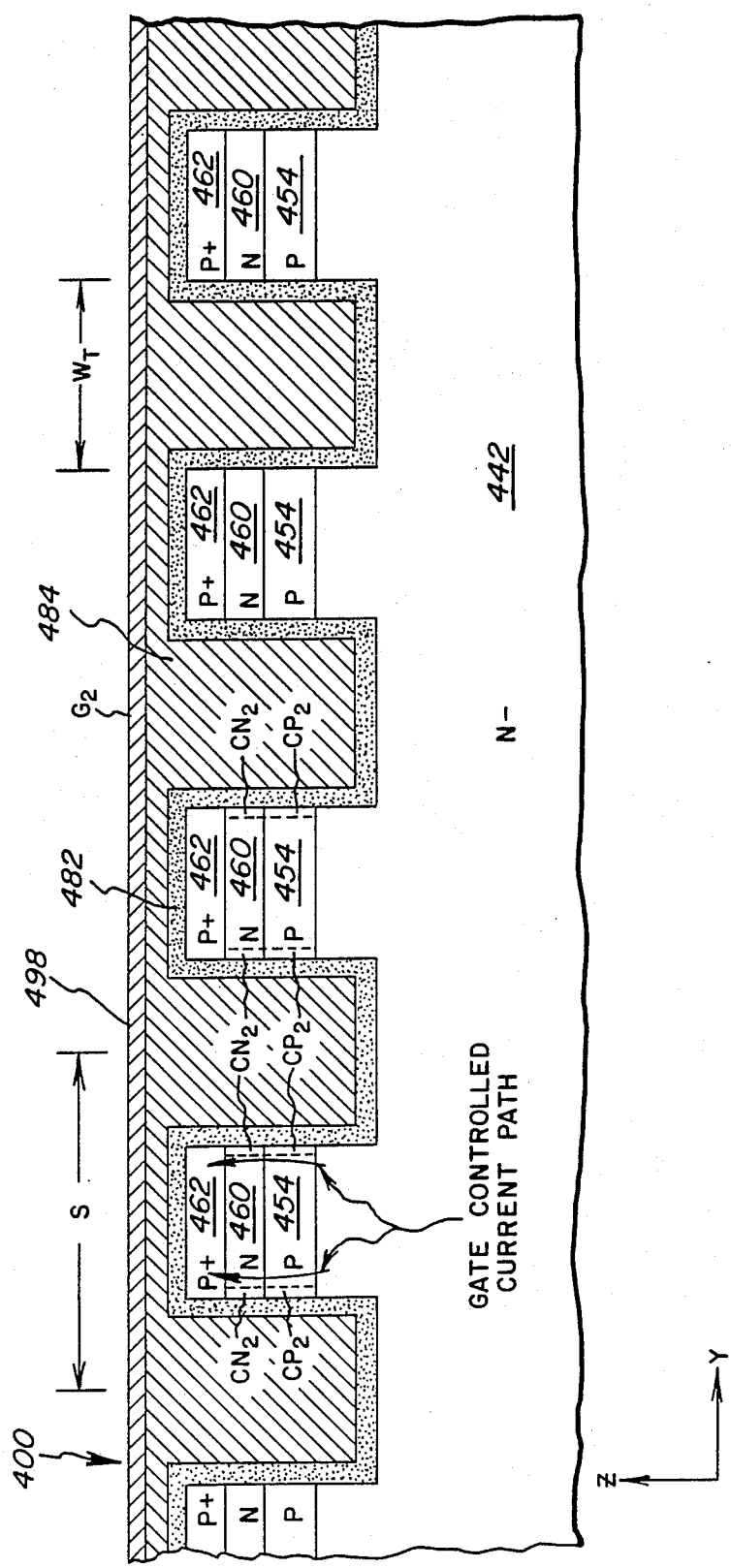

LATERAL METAL-OXIDE-SEMICONDUCTOR CONTROLLED TRIACS

BACKGROUND OF THE INVENTION

1. Field of the Invention

The present invention relates to the field of thyristors and triacs and more particularly to lateral, metal-oxide-semiconductor (MOS) controlled thyristors and triacs.

2. Prior Art

A thyristor is a semiconductor device having four layers (NPNP) which (1) can conduct current in only one polarity, (2) is capable of blocking voltage applied across its main electrodes in either of two opposing polarities, (3) has an ON state in which it can be latched and (4) can be triggered into that ON state by any one of a variety of techniques when a voltage of appropriate polarity and magnitude is applied across its main electrodes.

A triac is a five layer device which is essentially two thyristors constructed in the same semiconductor material in antiparallel relation. A triac can be triggered into its ON state to conduct in either direction, but only one of its component thyristors conducts at a time. Which component thyristor of a triac conducts is determined by the polarity of the voltage applied across the main terminals. When one of the antiparallel thyristors is conducting at the time the bias across the triac's main terminals is reversed, the stored carriers in the conducting triac must be prevented from triggering the other thyristor ON, or else the triac will remain in an ON state despite the reversal in the bias across the main electrodes. Such triggering can occur when the two thyristors are close enough together within the semiconductor body that the charges stored in the conducting thyristor have spread or can spread into the other thyristor in sufficient quantity to trigger it ON upon reversal of the main bias.

Some thyristors, once they have been triggered ON, remain ON until the bias across their main electrodes is removed or reversed. Other thyristors can be turned OFF by an appropriate signal applied to a control gate even while a bias encouraging continued conduction is maintained across their main electrodes. Such thyristors are known as gate turn-off thyristors. Triacs of both types are also known.

Thyristors and triacs are primarily constructed with their main current path running through the thickness of a semiconductor wafer between opposed major surfaces. Such thyristors are known as vertical current or vertical thyristors. One disadvantage of such vertical current devices is the fact that patterned device regions and electrodes may have to be provided on both surfaces of the semiconductor wafer. This complicates device fabrication and makes mounting the device in a package more difficult than is the case with devices which have one side which is uniform with a single electrode thereon.

Lateral structures in which all of the device patterning is done on a single surface of the semiconductor device are desirable from the fabrication and device connection points of view because the surface of the device opposite the patterned surface can be uniform or unpatterned and can be easily attached to a mounting surface in a package.

Lateral thyristors and triacs have been developed, however their operating characteristics, such as ON-resistance and current density, are generally inferior to those of vertical devices and none are available which provide gate turn-off of high current densities such as 100 amperes per square centimeter. In order for lateral triacs to provide maximum utility, they must be responsive to gate control both for turn-on and turn-off and must have the capacity to carry high currents and to turn those high currents off under gate control. Metal-oxide-semiconductor (MOS) gate control of thyristor and triac conduction is desirable because small amplitude control currents (essentially voltage control) can then control large amplitude currents in the main current path of the device.

An object of this invention is to provide lateral triacs capable of handling substantially increased current densities while providing gate control of both device turn on and device turn-off.

A further object is to provide lateral triac structures which provide device current density and voltage drop characteristics which are comparable to those of vertical devices.

SUMMARY OF THE INVENTION

The present invention provides lateral triac structures employing two metal-oxide-semiconductor gates for turn-on and turn-off through provision of lateral structures in which the width of the OFF channel is substantially greater than the width needed for the ON channel so that the OFF channel can divert sufficient current from the regenerative current path to turn the device OFF from its latched condition even under high current conditions.

Several different embodiments provide differing operation and control characteristics. A five layer NPNPN structure which is capable of latching in a thyristor mode in either of two directions of conduction is provided. These devices have two MOS gate electrodes, one to control conduction between a first emitter region and the body of the device and another to control conduction between a second emitter region and the body of the device.

In one set of embodiments, each gate electrode controls conduction through a single MOS channel. In an alternative embodiment, each gate electrode controls conduction in two adjacent opposing conductivity-type MOS channel regions disposed adjacent in series whereby for a given orientation of the potential across the main terminals of the device, each gate can serve either as an ON gate or as an OFF gate in accordance with the polarity and magnitude of the gate potential applied to that gate.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 2, 3 and 4 are cross-sectional views through the device of FIG. 1 taken along the lines 2—2, 3—3 and 4—4;

FIGS. 12 and 13 are cross-sectional views like those of FIGS. 10 and 11, but are of a modified version of the FIG. 9 device;

FIG. 18 illustrates a modified version of the device of FIG. 1.

DETAILED DESCRIPTION OF THE INVENTION

Figure 1:
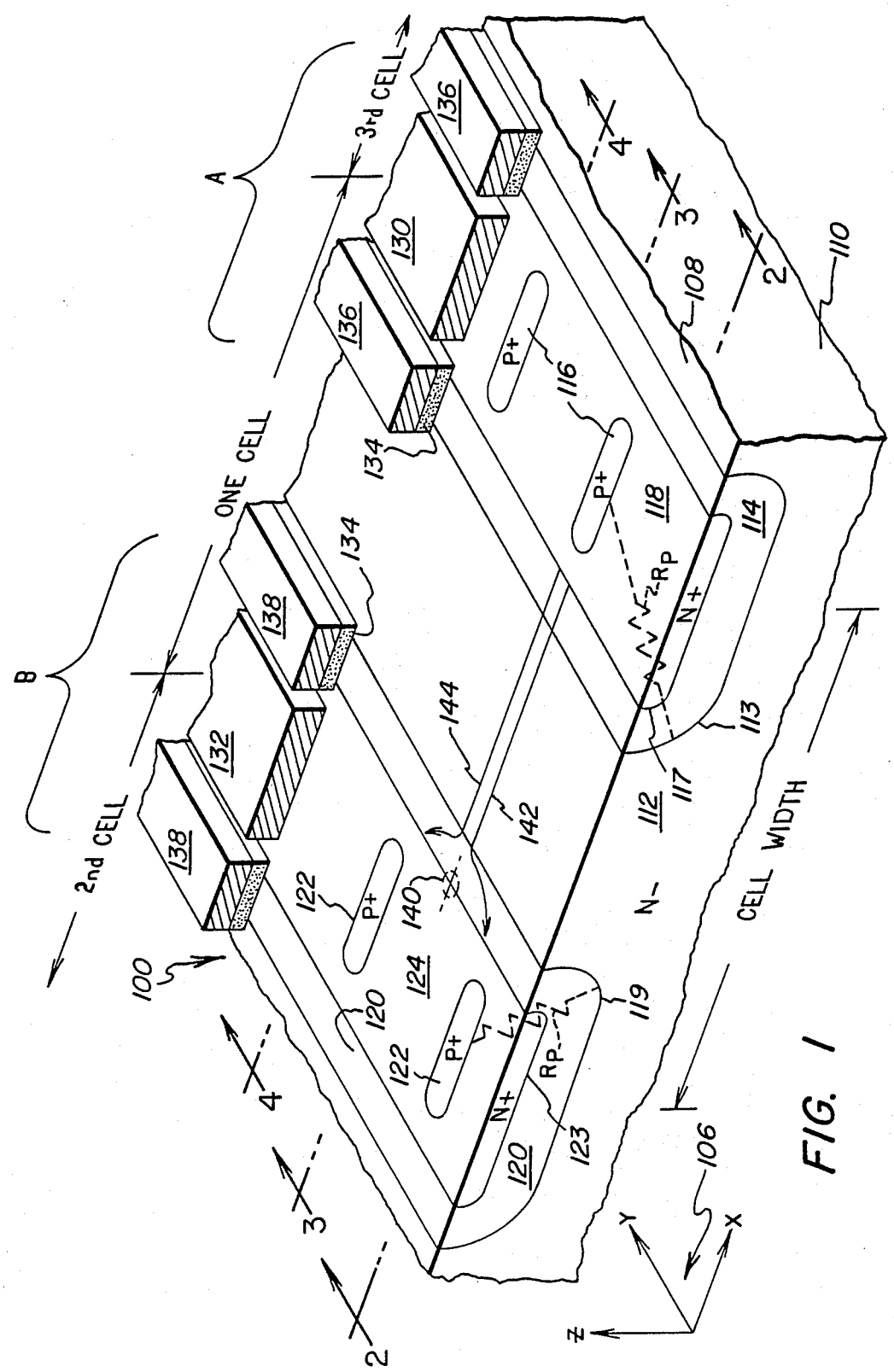
FIG. 1 is a perspective, partially cut away view of a first lateral triac in accordance with the present invention.
Figure 2:
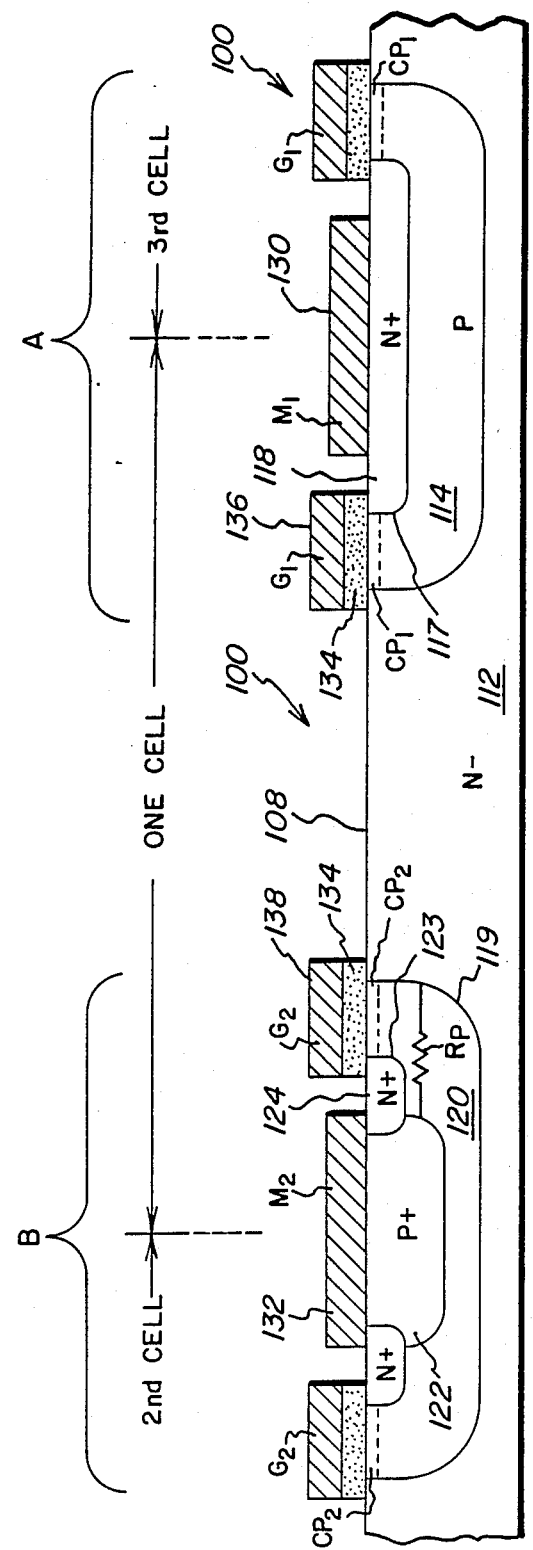

A portion of a multicell triac in accordance with the present invention is shown generally at 100 in FIG. 1 and in three cross-sections in FIGS. 2, 3 and 4 which are taken along the lines 2—2, 3—3 and 4—4 in FIG. 1, respectively. Triac 100 comprises a body 110 of semiconductor material which has an upper surface 108. The semiconductor material may preferably be silicon. A set 106 of three mutually perpendicular X, Y and Z axes at the lower left of FIG. 1 define a rectangular coordinate system which is used to identify directions in the following description.

Semiconductor body 110 includes a lightly doped N-type base or drift region 112 which is referred to as $N^-$ because of its light doping level. The drift region 112 may constitute the semiconductor wafer or may be a layer formed on or within a further substrate which is not shown. A structure designated A is disposed along the right side of the portion of device 100 which is shown in FIG. 1. Structure A includes a moderately-doped P-type region 114 which extends into the base region 112 from the upper surface 108 of the semiconductor body. Region 114 is elongated in the Y-direction. A plurality of more heavily doped P-type (P+) regions 116 extend into the P-type region 114 from the upper surface 108 of the semiconductor body and are disposed in a Y-direction-extending row. P+ regions 116 are spaced apart in the Y-direction by P-type region 114 and by rungs of a ladder-shaped N+ region 118 which extends into P-type region 114 and P+ regions 116 from surface 108. N+ region 118 is oriented with its rails extending in the Y-direction and its rungs extending in the X-direction between adjacent P+ regions 116.

A second, preferably identical structure designated B, is disposed along the left side of the portion of device 100 which is shown in FIG. 1 and is spaced from structure A by base region 112. Structure B includes a second P-type region 120 which extends into base region 112 from the upper surface 108 of the body 110. Region 120 may preferably have the same shape, size, doping level and depth as region 114. Regions 114 and 120 may preferably be formed by a single diffusion step. A plurality of spaced apart, heavily doped P-type (P+) regions 122 extend into the P-type region 120 from the upper surface 108 of the semiconductor body. These P+ regions may preferably have the same shape, size, doping level and depth as regions 116 and are spaced apart in the Y-direction. Regions 116 and 122 may preferably be formed by a single diffusion step. A heavily doped N-type (N+) region 124 extends into the region 120 and regions 122 from the upper surface 108. Along the surface 108, N+ region 124 spaces the P+ regions 122 from P-type region 120. Region 124 may preferably have the same configuration, size, depth and doping level as region 118 and is preferably formed simultaneously therewith in a single diffusion step. The P+ regions 122 of the B structure are preferably aligned midway between the center of the P+ regions 116 opposite them in the A structure.

The electrode structure of device 100 is shown only toward the back of FIG. 1, the forward portions being cut away in the illustration in order to provide maximum clarity as to the surface relationships among the various regions having even numbers between 112-124. It will be understood, however, that each of these electrode structures extends forward for substantially the entire Y-direction length of P-type regions 114 and 120. In structure A a first ($M_1$) main electrode 130 makes ohmic contact to the N+ region 118 and each of the P+ regions 116. A pair of first ($G_1$) insulated gate electrodes 136 are disposed over the surface portion of P region 114. These $G_1$ gate electrodes are disposed on opposite sides of the row of P+ regions 116 and each extends in the X-direction over the P-type region 114 from the edge of or from slightly over the N+ region 118 to or slightly over the $N^-$ region 112. The $G_1$ gate electrode 136 which is to the left of $M_1$ electrode 130 in FIG. 1 is part of the "one cell" which is illustrated in the lateral center of FIG. 1. The $G_1$ gate electrode 136 to the right of $M_1$ electrode 130 in FIG. 1 is part of the incompletely shown "third cell" which extends to the right from the middle of $M_1$ electrode 130. Each of these $G_1$ insulated gate electrodes 136 is spaced from body 110 by a dielectric layer 134 and serves to control conduction in an MOS channel portion $CP_1$ of the P-type region 114 within the semiconductor material along the surface 108. $CP_1$ stands for Channel in the P region under gate 1.

In a similar manner in structure B, a second ($M_2$) main electrode 132 makes ohmic contact to N+ region 124 and each of the P+ regions 122. A pair of second ($G_2$) insulated gate electrodes are disposed over the surface portion of P region 120. These $G_2$ gate electrodes are disposed on opposite sides of the row of P+ regions 122 and each extends in the X-direction over the P-type region 120 from the edge of or from slightly over the N+ region 124 to or slightly over the $N^-$ region 112. The $G_2$ gate electrode 138 which is to the right of $M_2$ electrode 132 is part of the "one cell" in the lateral center of FIG. 1 (which extends from the middle of the $M_1$ electrode 130 to the middle of $M_2$ electrode 132) while the $G_2$ electrode to the left of $M_2$ electrode 132 is part of the incompletely shown "second cell" which extends to the left from the middle of $M_2$ electrode 132. Each $G_2$ gate electrode 138 controls conduction in an MOS channel portion $CP_2$ of the P-type region 120 within the semiconductor material along the surface 108. The gate electrodes are preferably doped polysilicon, but may be metal or other conductors.

The details of the relationships among the regions having even reference numbers between 112-124 are illustrated in greater detail in cross-section in FIGS. 2, 3 and 4. The cross-section of FIG. 2 is taken along the line 2—2 which extends across the device of FIG. 1 from left to right and passes through a P+ region 122 on the left and between two of the P+ regions 116 on the right. The FIG. 3 cross-section is taken along the line 3—3 which extends across the device of FIG. 1 from left to right and passes between two P+ regions 122 on the left and passes between two P+ regions 116 on the right. The FIG. 4 cross-section passes through N+ region 124 on the left in between two P+ regions 122 and passes through a P+ region 116 on the right. The main power ($M_1$ and $M_2$) electrodes and the gate ($G_1$ and $G_2$) electrodes which are omitted from the front portion of FIG. 1 are included in the cross-sections in FIGS. 2-4. The complete device 100 comprises, along a selected cross-section, a plurality of the A structures and a plurality of the B structures which alternate with each other in the X-direction and are spaced apart in the X-direction by base region 112. The width of the portion of the base region which spaces individual A and B structures apart is determined in accordance with the maximum voltage to be held off and the doping level in that region. It will be understood that the plurality of A structures along the selected cross-section may be separate from each other in plan view with only the electrodes common to all of them or the entire A structure may be a single continuous structure which is serpentine, comb-like or in some other way includes segments which in cross-section appear separate, but which in plan view are connected together.

In operation, if the second main ($M_2$) electrode 132 is grounded and a positive main bias voltage is applied to the first main ($M_1$) electrode 130, then that main bias encourages the flow of electrons from the $M_2$ electrode 132 to the $M_1$ electrode 130 and the flow of holes from $M_1$ electrode 130 to the $M_2$ electrode 132. Such flow is prevented by reverse bias of the PN junction 119 between P-type region 120 and N− base region 112. The electrodes 130 and 132 each short-circuit the PN junction between the N+ and P+ regions thereunder, respectively. These short circuits prevent internally generated carriers from turning the device ON. Therefore, device 100 is normally in an OFF state when the bias on the $G_2$ gate electrodes 138 does not induce an MOS channel in the underlying P-type region 120. The MOS channel under gate $G_1$ in region 114 may be either on or off. When that channel is on, it shorts the PN junction 113. When junction 113 is shorted, the current magnitude at which latching occurs becomes very high. When that channel is off, the latching current depends on the efficacy of the N+P+ short created by electrode 132 at the other side of the device. The more effective that N+P+ short is, the higher the latching current becomes. Consequently, so long as the voltage applied between $M_1$ and $M_2$ electrodes 130 and 132 is less than the breakdown voltage of the device, the device remains in the OFF state until it is triggered ON.

To render the device 100 conductive between its terminals $M_1$ and $M_2$ (with $M_1$ positive and $M_2$ at ground as specified above), a voltage which is more positive than the threshold voltage for the $G_2$ gate electrode 138 is applied thereto. In response to that applied voltage, the $G_2$ gate electrode induces an MOS channel ($CP_2$) in the P region 120 along the surface 108 between (and connecting) the N+ region 124 and the N− region 112. The induced MOS channel $CP_2$ is conductive to electrons and enables a substantial quantity of electrons from $M_2$ electrode 132 to flow through the N region 124, through the MOS channel portion $CP_2$ of region 120 and into the N− region 112. This shorts the reverse biased PN-junction 119. Two different modes of operation are possible depending on whether the channel $CP_1$ under the $G_1$ gate is on.

If the channel $CP_1$ under the $G_1$ gate is on, i.e., conductive to electrons, then the junctions 113 and 114 are shorted and the electrons from channel $CP_2$ flow across region 112, through the channel $CP_1$ and into region 118 to electrode 130. Under these conditions, the device operates as an FET and does not latch.

If the channel $CP_1$ in region 114 under gate $G_1$ is off, then the electrons from channel $CP_2$ collect in and create a stored charge in the N− base region 112 and lower the potential of region 112 with respect to P region 114 and P+ region 116. When this potential decrease reaches a forward bias value for the semiconductor material (about 0.7 volts in silicon) holes will flow from region 114 into base region 112. Once in region 112, these holes diffuse throughout base region 112. Those which reach the depletion region of junction 119 are drawn across junction 119 into the non-depleted portion of P region 120 by the depletion region field. In order to reach $M_2$ electrode 132, these holes must flow through the portion of P-type region 120 which is underneath N+ region 124 in order to reach P+ region 122 enroute to the $M_2$ electrode 132.

In flowing through the P region 120 in its relatively thin portion disposed beneath region 124, i.e., between the N+ region 124 and the N− base region 112, those electrons encounter a resistance $R_P$ which results in a current times resistance (IR) voltage drop through that part of the P-type region 120. Holes following paths such as 142 and 144 (i.e., which arrive at region 120 at a point 140 which is midway between two of the P+ regions 122) follow a longer transit path through P region 120 to reach regions 122 than other holes and therefore encounter the greatest resistance. Consequently, the portion of the junction 123 in the vicinity of point 140 will experience the largest voltage increase as a result of the IR drop in region 120. That voltage rise raises the potential at the portion of junction 123 in the vicinity of point 140 to above the potential at which the $M_2$ electrode 132 holds the regions 122. With sufficient hole current flow, this increase in potential is sufficient (greater than about 0.7 volts in silicon) to forward bias those portions of the P-N junction 123 which are furthest from the nearest region 122. Once that portion of the junction is forward biased, it injects electrons into P-type region 120 from which those injected electrons flow into the base region 112. This electron flow supplements the flow through the channel $CP_2$ in region 120 under gate $G_2$ and, unlike the channel electron flow, will continue even if the turn-on voltage is removed from the $G_2$ gate electrode 138. This establishes the regenerative action which latches the triac in its ON condition. Triac 100 will remain ON as long as the main bias is maintained across its main electrodes 130 and 132 or until it is turned OFF by a gate signal. Thus, the turn-on gate voltage on the ON gate 138 may be removed without interrupting the current between main electrodes 130 and 132.

From the above explanation, it can be seen that the combination of the spacing between the P+ regions 122, the sheet resistance of the P region 120 and the minimum separation at surface 108 between region 120 and regions 122 determines the device current density at which latching will occur when the channel $CP_1$ under gate $G_1$ is off. Increasing any one or more of the spacing between adjacent regions 122, the sheet resistance of region 120 and the x-direction width of the portion of region 124 which spaces region 122 from region 120 along surface 108 decreases latching current since that increases the resistance in the current path from point 140 to the nearest regions 122. However, since the device is symmetric, increasing spacing also reduces hole injection efficiently at the anode side since the regions 116 (or 122) are more efficient hole injectors than regions 114 (or 120) because of their higher doping levels. A latching current density of about 10 amps/cm$^2$ is about the highest which is desirable for the majority of device applications. Depending on the characteristics of a specific device, it may be found desirable to continue to apply the ON gate turn-on voltage to gate $G_2$ as long as the device is ON since that provides a channel electron path in parallel with injection by junction 123.

If the device is initially rendered conductive via the FET mode of having both channels on, it can be converted into a latched ON state by turning off the channel $CP_1$ under gate electrode $G_1$. This removes the short across junction 113 and the electrons from electrode 132 accumulate in region 112 until they lower the potential of region 112 enough to forward bias junction 113 in the manner described above with respect to turn-on directly into the latched condition.

If the bias voltage applied to the ON gate electrode 138 in order to turn the device ON has not been removed prior to the initiation of turn-off, it is preferred to remove it at that time. However, that will not by itself turn the device off from its latched condition.

In order to turn the device OFF from its latched condition (in which $M_2$ electrode 132 is grounded and $M_1$ electrode 130 is more positive) by gate control, it is preferred to apply a voltage to the $G_1$ gate 136 which is more positive than the threshold voltage for that gate electrode. This induces an MOS channel $CP_1$ across the P-type region 114 within the semiconductor material along the surface 108 which is conductive to electrons. This diverts electrons from flowing across the junction 113 into the region 114 to flowing directly across region 114 to the N+ region 118 within the channel $CP_1$ and on to electrode 130. This effectively shorts the P-N junction 113 between the N$^-$ base 112 and the P region 114 at surface 108, thereby reducing the voltage across that junction to less than the voltage across a forward biased junction. As a result, the P-type region 114 ceases to inject holes into the base 112 and the flow of holes across the base region 112 into the P-type region 120 is reduced to a value which no longer sustains a forward bias on the junction 123 between the N+ region 124 and the P-type region 120. Junction 123 thus ceases injecting electrons into the N$^-$ base region 112. In this way, the regenerative action within the device 100 is interrupted and the device unlatches and turns OFF. However, this turn-off can result in large voltages being applied across the $M_1$–$M_2$ electrode set while there are large quantities of minority carriers still present in the base region 112. This results in a reduced safe operating area for the device.

An alternative, two-stage, technique for turning device 100 OFF is to turn both channels $CP_2$ and $CP_1$ on at the same time so that the device operates in the FET mode described above in which electrons flow from the $M_2$ electrode 132 into the N+ region 124 through channel $CP_2$ into base 112 through channel $CP_1$ into N+ region 118 to $M_1$ electrode 130. If this two stage turn-off technique is being used to turn device 100 off, then the ON gate on voltage may be left on (rather than removed as discussed above), in which case the OFF gate (136 over channel $CP_1$) is simply turned on also to initiate the turn-off process by placing the device in the FET mode. As discussed above, turning on the OFF channel $CP_1$ stops the injection of holes and junction 123 loses its forward bias and ceases to inject electrons. Thus, the only current flow mechanism is the FET mode itself. In this FET mode, excess minority carriers in base 112 recombine therein or are swept out of base 112. Once the excess minority charge in base 112 has dissipated, the channel $CP_2$ on the cathode (grounded) side is turned off by removal of its gate voltage. That stops the FET current so that current ceases to flow through the device and simultaneously removes the short across the reverse biased junction 119. As a consequence, the device turns OFF and can hold off the increase in voltage across it which results from interruption of the device current through its load circuit. This voltage appears across junction 119 and its depletion regions whose width increases as the voltage across the device increases. From a circuit standpoint, this MOS controlled thyristor or triac (MCT) will appear to have FET turn-off speed when it is turned off in this two step fashion. The drawback of this two-step turn-off is that the forward voltage drop of the MCT in the FET mode may be too high for some circuits in which the device may be used.

Since the device 100 is completely symmetric, it will operate in a similar fashion if the polarities of the biases are reversed. While the regions 116 and 122 have been shown and described as being heavily doped P+ regions, those skilled in the art will recognize that a functional device will also result if these regions are P type regions rather than P+ regions. In that case, the regions 116, 122 may merely be portions of regions 114, 120 which are masked during the N+ diffusion which forms N+ regions 118, 124, respectively.

Figure 5:
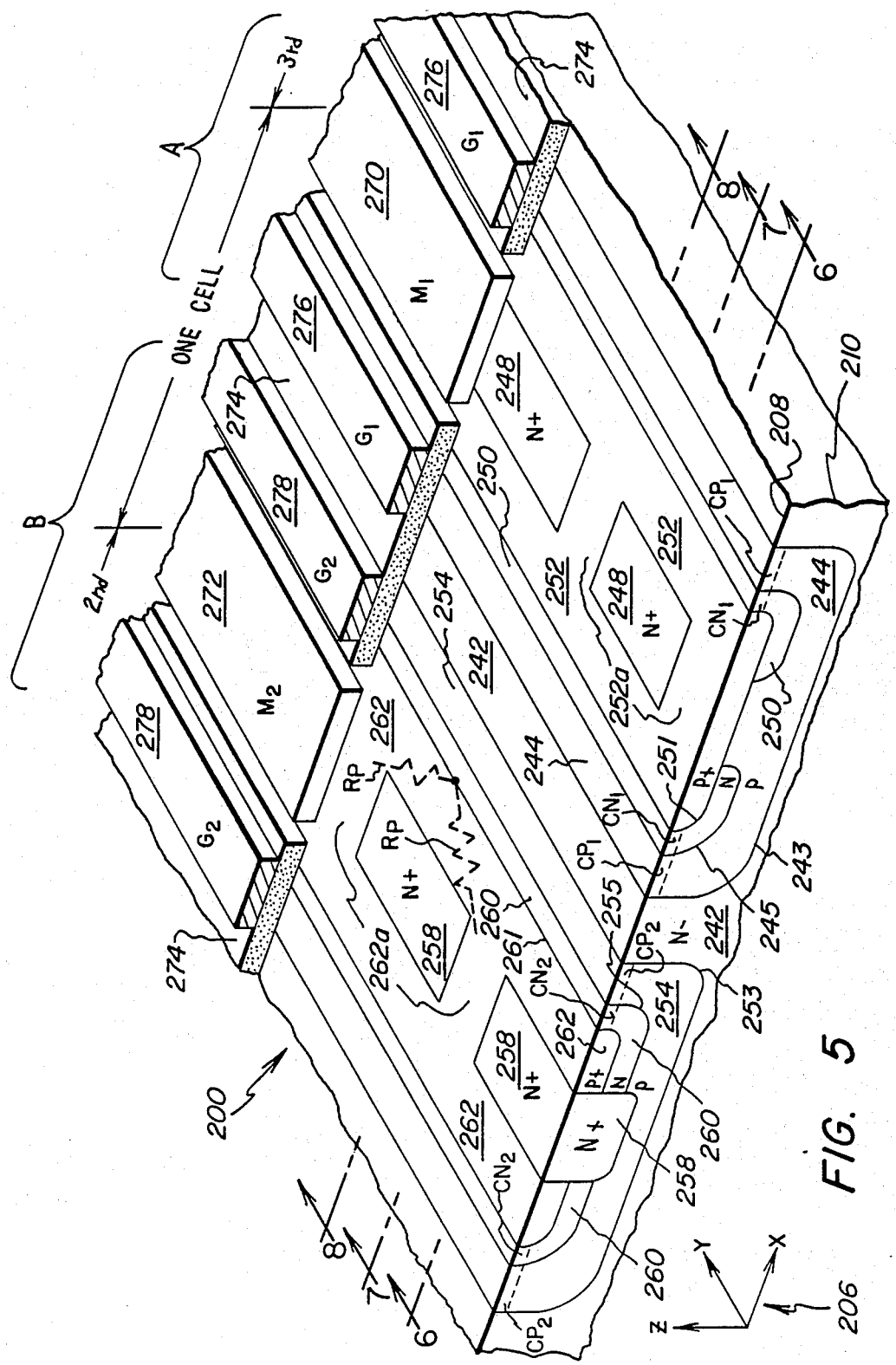
FIG. 5 is a perspective, partially cut away view of an alternative semiconductor structure in accordance with the present invention.
Figure 6:
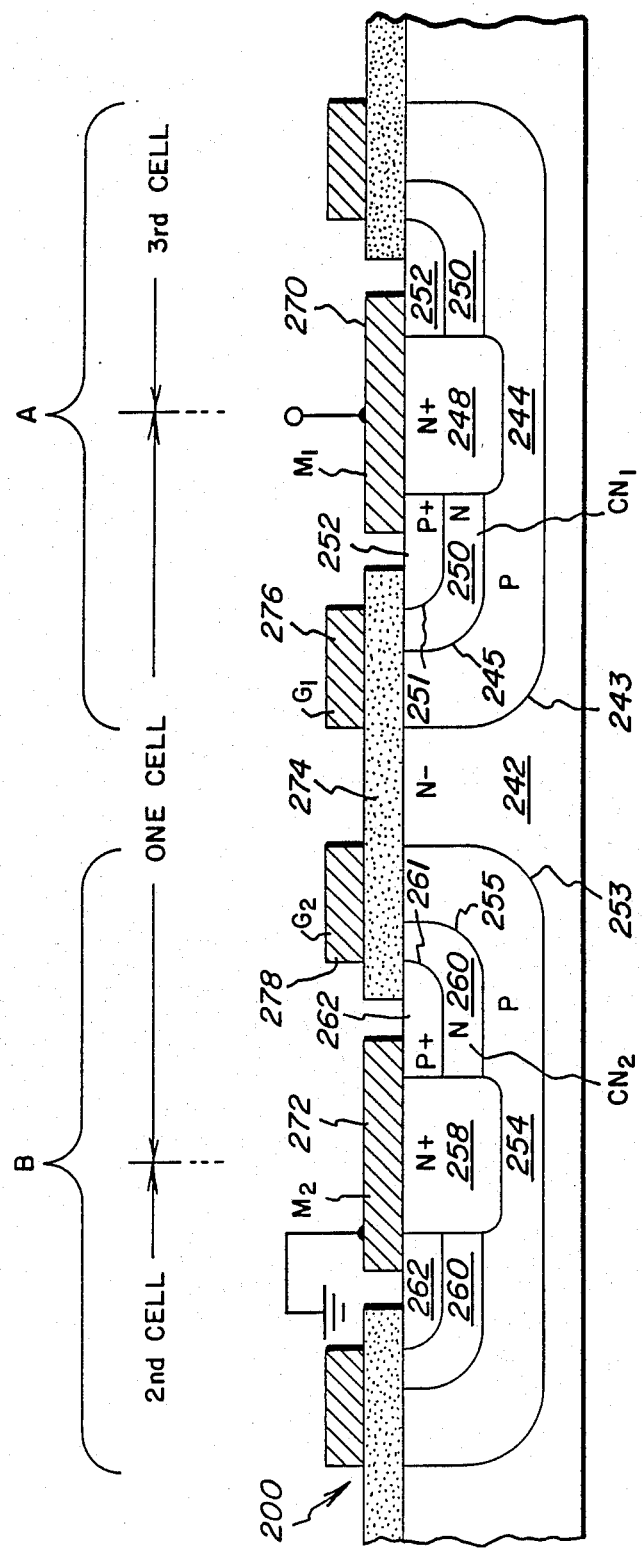
FIGS. 6, 7 and 8 are cross-sectional views through the device of FIG. 5 taken along the lines 6—6, 7—7 and 8—8, respectively.
Figure 7:
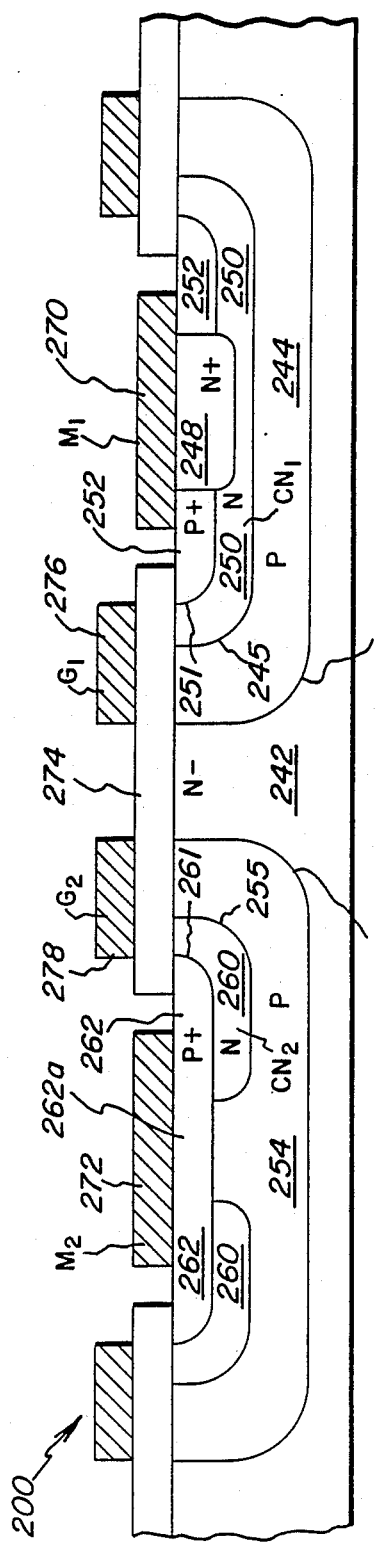
Figure 8:
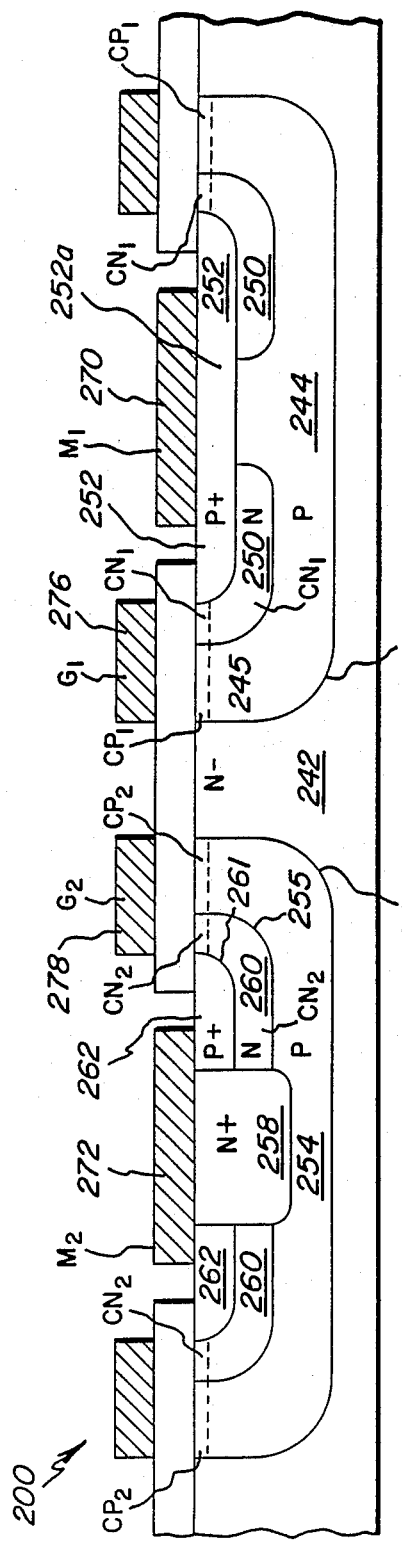

An alternative embodiment of a triac in accordance with the present invention is illustrated generally at 200 in a perspective view in FIG. 5 and in cross-section in FIGS. 6–8. This triac comprises a body 210 of semiconductor material including an N$^-$ base or drift region 242 which extends to the upper surface 208 of the semiconductor material. Along the right side of the portion of the device illustrated in FIG. 5, a structure A includes a number of semiconductor regions each of which extends to surface 108. These regions are a P-type region 244 which extends into the body 242 from the upper surface 208; an N-type region 250 which extends into the P-type region 244 and forms a PN junction 245 therewith; a P+ region 252 which extends into the N type region 250 and forms a PN junction 251 therewith; and a plurality of N+ regions 248 which extend through the P+ region 252 and N-type region 250 into the P type region 244. The P-type region 244, the N-type region 250 and the P+ region 252 are each elongated in the Y-direction, i.e., perpendicular to the plane of the cross-section in FIG. 5, while the N+ regions 248 are spaced apart in that direction by portions 252a of P+ region 252.

As is seen toward the back part of FIG. 5, the structure A includes a first main ($M_1$) electrode 270 disposed on the surface 208 along the righthand side of the figure. The $M_1$ electrode 270 is disposed in ohmic contact with the N+ regions 248 and the P+ region 252 which respectively ohmically connect the $M_1$ electrode to N-type region 250 and P-type region 244. A dielectric layer 274 overlies the upper surface 208 of the semiconductor material where the P-type region 244 and N-type region 250 extend to the upper surface 208. A pair of first insulated gate ($G_1$) electrodes 276 are disposed on the dielectric 274 over the regions 244 and 250 where they extend to the surface 208. The $G_1$ gate electrodes 276 control conduction in MOS channels $CP_1$ and $CN_1$ through regions 244 and 250, respectively, along surface 208. The channel in region 244 is referred to as channel $CP_1$ for Channel in the P region under gate 1 and the channel in region 250 is referred to as channel $CN_1$ for Channel in the N region under gate 1. The structure A includes two each of channel region $CP_1$ and $CN_1$. One of each is within the "one cell" shown in the center of FIGS. 5-8 and the other is part of the "third cell" which extends beyond the right hand edge of the Figure.

During its formation, the N type region 250 may extend under the locations in which the N+ regions 248 are eventually formed thereby connecting the lefthand and righthand portions of region 250 in the A structure or region 250 may consist of two spaced apart diffused regions which are only connected by their common connection to regions 248. As shown in FIG. 7, the N+ regions 248 may only extend into the N-type region 250 instead of through it as shown in FIG. 6. In an actual device, each of the N+ regions 248 is made the same depth for process simplicity, thus region 248 in FIG. 7 illustrates a modified construction, not a difference within one device between different regions 248. The important thing is that there is a good ohmic connection between each region 248 and region 250 so that regions 248 provide good low resistance connections between $M_1$ electrode 270 and region 250.

The portions 252a of P+ region 252 which are between (space apart) adjacent N+ regions 248 are continuous with the underlying P-type region 244 as seen in FIGS. 5 and 8. Thus, portions 252a provide good low resistance connections between $M_1$ electrode 270 and region 244. The other portions of P+ region 252 are spaced from region 244 by N-type region 250. In this way, external contacts to region 244 are spaced apart in the Y-direction and interleaved with the external contacts to region 250.

A similar structure B is disposed along the lefthand side of the portion of the device which is shown in FIGS. 5-8. Structure B faces structure A and is spaced therefrom by base 242. The B structure comprises P-type region 254, N+ regions 258, an N-type region 260 and a P+ region 262. The N+ regions 258 in the B structure are preferably aligned with the center of the portions 252a of the P+ region 252 which are directly opposite them in structure A. Similarly, the N+ regions 248 of structure A are aligned with the center of the portions 262a of region 262.

The structure B includes a second main ($M_2$) electrode 272 disposed in ohmic contact with the N+ regions 258 and the P+ region 262 which ohmically connect the $M_2$ electrode to N-type region 260 and P-type region 254, respectively. A pair of insulated gate ($G_2$) electrodes 278 are disposed over P-type region 254 and N-type region 260 where they extend to the surface 208. $G_2$ gate electrodes 278 control conduction through MOS channels $CP_2$ and $CN_2$ (FIG. 8) in regions 254 and 260, respectively, adjacent that surface. The dielectric layer 274 is preferably a native grown oxide in order to provide good metal-oxide-semiconductor (MOS) control over conduction in the channels in the regions 244, 250, 254 and 260. The A and B structures are preferably identical and aligned with the regions 252a centered between the regions 262a. This provides a symmetrical device whose operating characteristics are identical in both directions.

The $M_1$ main electrode 270 shorts the junctions between P+ region 252 and the N+ regions 248. $M_2$ main electrode 272 shorts the junctions between P+ region 262 and N+ regions 258. These shorts are known as emitter shorts and serve to prevent interally generated charge carriers (holes and electrons) from turning the device ON.

Further details of the structure of device 200 will now be explained in connection with FIG. 5 and the cross-sectional views in FIGS. 6-8 which are taken along the lines 6—6, 7—7 and 8—8 in FIG. 5. The FIG. 6 cross-section passes through an N+ region 258 on the left and an N+ region 248 on the right. The FIG. 7 cross-section passes through a spacer portion 262a of region 262 on the left and an N+ region 248 on the right. The FIG. 8 cross-section passes through an N+ region 258 on the left and a portion 252a of P+ region 252 on the right.

Although P-type region 244 and P+ region 252 have been shown in the drawings and described as being separate regions, it will be understood that operationally they comprise a single continuous region having different conductivities. The same is true of N-type region 250 and N+ regions 248; P-type region 254 and P region 262; and N-type region 262 and N+ regions 258.

As seen at the right side of FIG. 7, since the N+ region 248 is continuous with the N-type region 250, the PN junction 251 between N-type region 250 and P+ region 252 is shorted by the $M_1$ electrode 270 which makes ohmic contact to both the P+ region 252 and the N+ regions 248. The junction 245 between P-type region 244 and N-type region 250 is also shorted by the ohmic contact between $M_1$ electrode 270 and N+ regions 248 and P+ region 252 (see FIGS. 7 and 8 together). In a similar manner, on the left side of FIG. 8, the PN junction 261 between N-type region 260 and P+ region 262 is shorted by the combination of the N+ region 258 and the $M_2$ main electrode 272 and the PN junction 255 is shorted by the combination of P+ regions 262 (shown in FIG. 7) and N+ regions 258 and the $M_2$ electrode.

Each of the just discussed short circuits is at a location which is remote from the channel portions of regions 244, 250, 254 and 260.

The operation of device 200 is now described. If the $M_2$ main terminal (electrode) 272 is grounded and a positive bias voltage is applied to the $M_1$ main terminal 270, then that main bias encourages the flow of electrons from $M_2$ electrode 272 to $M_1$ electrode 270 and the flow of holes from $M_1$ electrode 270 to the $M_2$ electrode 272. Such flow is prevented by reverse bias of the PN junction 253 between P-type region 254 and N− base region 242 which holds off the entire applied main bias. Consequently, even though the main bias is in a direction which tends to forward bias the PN junction 243 between the P-type region 244 and the N− base region 242, that junction is not in fact forward biased and no current flows through the device.

Despite the applied bias across the main terminals, the device is prevented from turning ON in response to internally generated carriers because the P+ region 262 is shorted to the N+ regions 258 (FIG. 8) by the $M_2$ main contact 272. These emitter shorts conduct internally generated hole to the main electrode $M_2$ without inducing regeneration because the flow of the internally generated holes does not provide a current as large as the latching current of the device.

In order to turn the device ON, a voltage is applied to the $G_2$ gate electrode 278 which is more positive than its threshold voltage to induce the $CP_2$ channel portion of P-type region 254 to become conductive to electrons. Creation of this MOS channel enables electrons (see FIG. 8) to flow from $M_2$ electrode 272 into the N+ regions 258 on into the N-type region 260 and across P-type region 254 within $CP_2$ into the N− base region 242. This effectively short circuits the reverse biased junction 253. This device can be operated in an FET mode by applying a positive bias to gate $G_1$ to turn on channel $CP_1$ as has been described above with respect to device 100. If channel $CP_1$ is off, then these electrons collect in and create a stored charge in the N− base 242. In a fashion similar to that described above with respect to device 100, these stored electrons lower the potential of region 242 until junction 243 becomes forward biased and region 244 injects holes into region 242.

The holes which flow from P-type region 244 into N− region 242 offset the charge of the stored electrons and diffuse throughout N− region 242. Those which reach the depletion region of the reverse-biased junction 253 are drawn across the junction into the non-depleted portion of P-type region 254 where they flow through P region 254 under N-type region 260 to P+ region 262 and on to the $M_2$ main electrode 272. The holes in flowing through the P-type region 254 create a current times resistance (IR) voltage drop as a result of their flow through the resistance $R_p$ in that region in the same fashion as was described above with respect to device 100 of FIGS. 1–4. A sufficient (threshold value) hole flow, will forward bias a portion of the junction 255 in a manner similar to that described above with respect to device 100 shown in FIGS. 1–4. This forward bias occurs first at those portions of the junction 255 which are farthest from portions 262a of P+ region 262. Therefore, the further apart the portions 262a are, the smaller the threshold value of hole current will be. The forward bias of these junction portions causes them to inject electrons into the P-type region 254. The larger the hole flow (current) is (above the threshold value) the larger the area of the forward biased portions of the junction 255 become and the more electrons are injected. Such injected electrons flow across the reverse biased junction 253 into N− region 242, on to forward biased junction 243 and across junction 245 into N region 250 in the same manner as the electrons whose flow was initially induced by the turn-on voltage applied to ON gate 278. When PN junction 251 and PN junction 255 both have forward biased portions, the device latches ON in a thyristor mode and will remain ON even after the gate voltages used to initiate conduction have been removed.

The portions 252a and 262a of the N+ regions 252 and 262 which space the N+ regions 248 and 258, respectively, apart are substantially narrower than the N+ regions 248 and 258 in order to lengthen the current path followed by holes in the P-type regions 244 and 254 and thereby to minimize the current at which the device will latch. At the same time, these spacing portions of the P+ regions along a given power electrode are preferably placed close enough together to ensure that the device will not have too low a hole injection efficiency.

Normally, the primary source of internally generated carriers is thermal generation of hole/electron pairs. However, because incident radiation can also induce such carriers, use of such a device in a high radiation environment, may place a lower limit on acceptable latching current values.

Concerns over lower limits on latching current can be eliminated if it is decided to always turn an OFF channel on to hold the device in the OFF state when it is desired to have the device OFF.

The latching current of device 200 can be minimized by omitting the ohmic contacts between the main terminal electrodes $M_1$ and $M_2$ and the P-type regions 244 and 254, respectively. Such a structure may be provided by making the N+ regions 248 and 258 each a continuous stripe extending in the Y-direction in FIG. 5. Then, any cross-section along an X-Z plane would be like that shown in FIG. 6 where there is no connection between P-type region 244 and P+ region 252 or between P-type region 254 and P+ region 262. Under these conditions, no short circuit of the junctions 245 and 255 is provided.

With this structure and the voltages discussed above, the region 252 becomes the hole injecting region. Most holes injected into region 250 by region 252 will successfully cross the N-type region 250 and will enter region 244 from which they will flow into base 242 as has been described.

Regions 248 and 258 have been shown and described as N+ regions which are formed by a diffusion which is separate from the one which forms N-type regions 250 and 260. However, regions 248 and 258 may be N-type material which is respectively part of region 250 or 260, with the regions 248 and 258 merely being masked during the P+ diffusion which forms regions 252 and 262.

In order to turn the latched device 200 OFF through gate control, it is necessary to interrupt the regenerative cycle by short circuiting at least one of the forward biased junctions to stop it from injecting carriers into the base 242. First, any turn-on voltage which may still be applied to the gate electrode 278 should be removed unless a two-step FET mode turn-off like that discussed above for device 100 is to be used. Non-FET turn-off is initiated by having channel $CP_1$ off and applying a voltage to the $G_2$ electrode 278 which is more negative than the threshold voltage for the creation of an MOS channel $CN_2$ in the N-type region 260, as shown in FIG. 8. Holes are conducted through this channel $CN_2$ directly from the P-type region 254 into the P+ region 262. Thus, the hole current flow through region 254 which has induced the forward bias on the junction 255 in the vicinity of the $G_2$ gate electrode 278 is short circuited into this less resistive path and the IR drop in the P-type region 254 is reduced to a level which no longer forward biases the junction 255. Once that junction is no longer forward biased, electrons cease to be injected from N-type region 260 into P-type region 254 and the electron portion of the device current is turned OFF. The device itself thereupon turns OFF.

Alternatively, the $G_2$ gate voltage may be made positive to turn on the channel $CP_2$ for electrons and the $G_1$ gate electrode 276 may have a voltage applied to it which is more positive than the threshold voltage for creation of an MOS channel $CP_1$ which is conductive to electrons at the surface of the P-type region 244. This combination of gate voltages places the device in an FET mode which is similar to that described above for device 100. Once the stored charges have dissipated from base 242, channel $CP_1$ is turned off by removing the voltage from gate $G_2$ and the device turns OFF.

Finally, the $G_1$ gate electrode 276 may have a voltage applied to it which is more positive than the threshold voltage for creation of the MOS channel $CP_1$. If the resistance of the resulting electron current path between base 242 and $M_1$ electrode 270 is low enough (which will normally be the case), the voltage across the PN junction 243 will be reduced to less than a forward bias voltage and hole injection will cease. This will result in loss of forward bias across junction 255 and the device will turn OFF. This turn-off technique is like that used with device 100 which lacks the channel region $CN_2$ and thus cannot be turned OFF by the gate at the cathode side.

Whichever of the above-described techniques is used to initiate device turn-off, the reverse biased junction which supports the voltage across main electrodes $M_1$ and $M_2$ is junction 253 and its associated depletion regions. If $CN_2$ and $CP_1$ are activated simultaneously, then some improvement in turn-off can be expected over what activation of either one alone provides.

Through any one of these effects or appropriate combinations of them, the gate electrodes 276 and 278 can turn OFF the device 200 without the voltage applied across the main electrodes 270 and 272 being removed or reversed.

Since the device 200 is symmetric, in the event that the $M_1$ electrode 270 is grounded and a positive voltage is applied to the $M_2$ electrode 272, the device can be turned ON and turned OFF in a manner similar to that described above. The complete symmetry of the device 200 assures that this embodiment of the invention will have substantially identical operating characteristics independent of the polarity of the bias across its main electrodes 270 and 272.

The device 200 of FIG. 5 is considered more versatile than the device 100 of FIG. 1 because of the presence of both ON and OFF channels along each side of the device's drift region 242 as compared to the device 100 which has an ON channel on one side of its drift region 112 and an OFF channel on the other side. The quantity of current which the device 200 can turn off under gate control is limited by the width of the OFF channels used to short circuit the injecting junction(s) to bring the device out of regeneration and latching. When only one gate is used to turn device 200 OFF, this OFF channel width is similar to that of the OFF channel in device 100 of FIG. 1. If both gates are used to short circuit injecting junctions in device 200, then that OFF channel width is effectively doubled.

Figure 9:
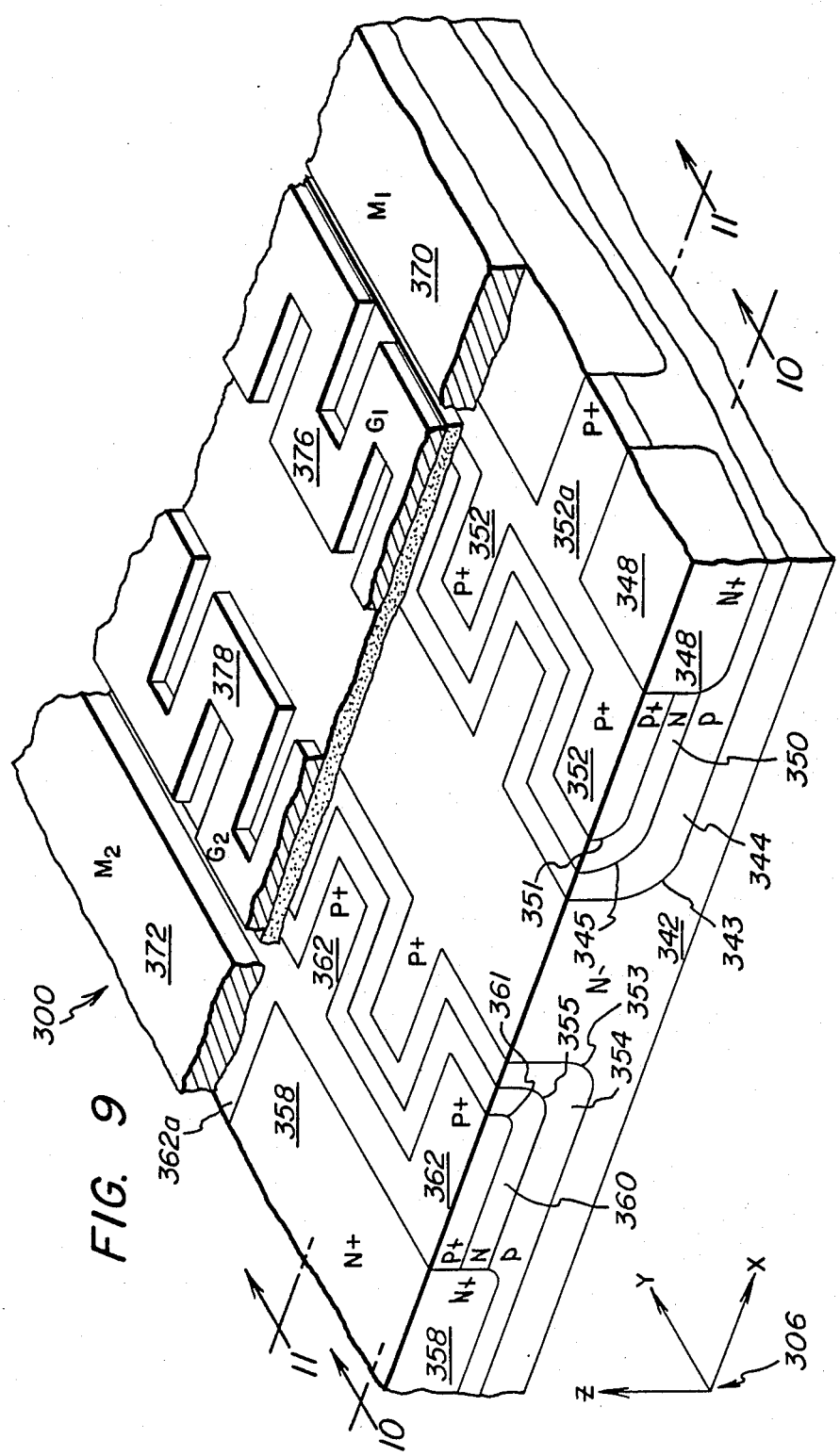
FIG. 9 is a perspective, partially cut away view of a modified version of the FIG. 5 device.

FIGS. 9-13 illustrate a modified version 300 of the just discussed device 200 of FIGS. 5-8. In device 300, N-type drift region 342, the P-type base regions 344 and 354, the N+ regions 348 and 358, the N-type channel regions 350 and 360 and the P+ emitter regions 352 and 362 correspond to regions 242, 244, 254, 248, 258, 250, 260, 252 and 262, respectively in device 200 of FIG. 5. However, rather than being uniform in the Y-direction as the corresponding regions are in the device 200, in device 300 the regions 344, 350, 352 together and regions 354, 360 and 352 together are provided with a comb-like configuration in which the tines extend in the X-direction and the tines of the regions on the right side of a cell point toward the tines of the regions on the left side of the cell and vice versa. Tines on opposite sides of the cell may be aligned with each other as shown in FIG. 9 or may be offset with respect to each other without a significant effect on the operating characteristics of the device because the width of the drift region 342 which separates the two side structures A and B of the device is substantially greater than the spacing between adjacent tines in either side structure.

This comb structure substantially increases the width of the OFF channels since the channel portions of regions 344, 350, 354 and 360 retain the same width in the Y-direction in device 300 in FIG. 9 as the channel portions of regions 244, 250, 254 and 260 have in the device 200 of FIG. 5 and in addition, each of the channels of each tine of the comb structure has an added width which is twice the X-direction length of the tine because of the existence of the channel region along both X-direction extending sides of the tine. The cross-section of FIG. 10 is taken along line 10—10 down the center of two aligned tines in the lefthand and righthand portions of the device structure, while the cross-section in FIG. 11 is taken along line 11—11 down the center of a space between adjacent tines on both sides.

The device 300 operates in substantially the same manner as the device 200 with two exceptions. First, the length of the tines tends to increase the IR voltage drop between the portions of junctions 345 and 355 which are respectively farthest from the regions 352a and 362a as compared to device 200. This tends to reduce the latching current. Second, the larger OFF channel width enables the device 300 to turn off a substantially larger current than the device 200.

Figure 10:
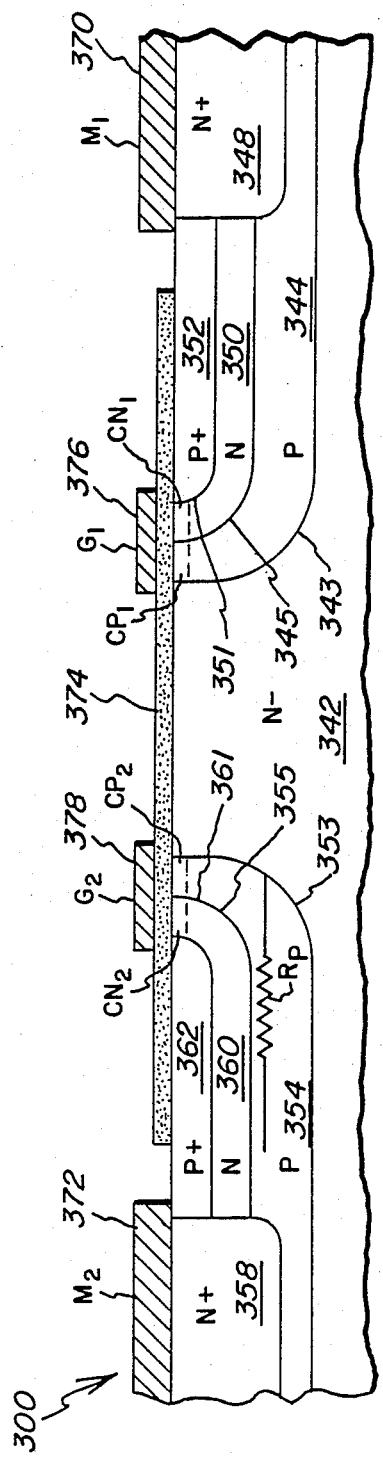
FIGS. 10 and 11 are cross-sectional views through the device of FIG. 9 taken along the lines 10—10 and 11—11.
Figure 11:
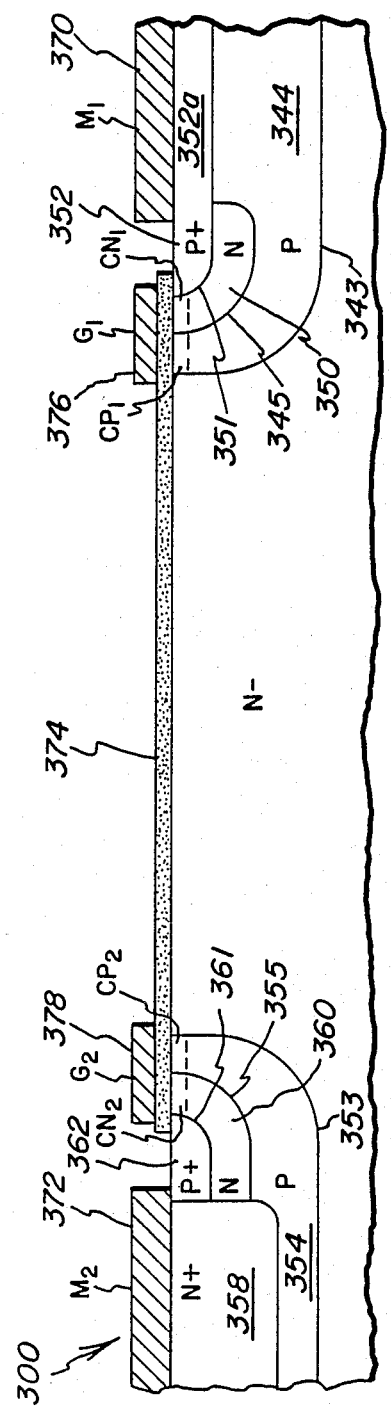

In FIGS. 9-11, the gate electrodes 376 and 378 are shown as being serpentine structures. Alternatively, each of the gate electrodes may have a uniform width which extends from the leftmost portion of the channel regions thereunder to the rightmost portion of the channel regions thereunder as shown in cross-section in FIGS. 12 and 13 where the $G_1$ gate electrode 376' extends from the extreme lefthand edge of the P region 344 in FIG. 12 to the extreme righthand portion of the $CN_1$ channel portion of region 350 in FIG. 13. In a similar manner, the $G_2$ gate 378' extends from the extreme lefthand side of the $CN_2$ channel portion of region 360 in FIG. 13 to the extreme righthand side of the P base region 354 in FIG. 12.

An alternative configuration for main electrodes $M_1$ and $M_2$ which may be used when the gate electrodes are doped polysilicon is shown in FIG. 12. An oxide layer is grown or deposited over the gate electrodes in the active area of the device prior to deposition of the main electrode metallization and each main electrode extends over its associated gate electrodes to provide an increased width of main electrode so that it can carry more current. In general, the preferred electrode system in each of the embodiments of FIGS. 1-7 is one in which the main electrodes $M_1$ and $M_2$ extend over the gate electrodes $G_1$ and $G_2$, respectively in order to increase the main electrode area. This is most easily accomplished using polysilicon gates. In the figures, the electrodes are illustrated as separate and non-overlapping for clarity in illustrating the invention.

Devices 100, 200 and 300 may be fabricated using a self-aligned gate process for establishing the length of the channel regions under their gate electrodes.

Figure 14:
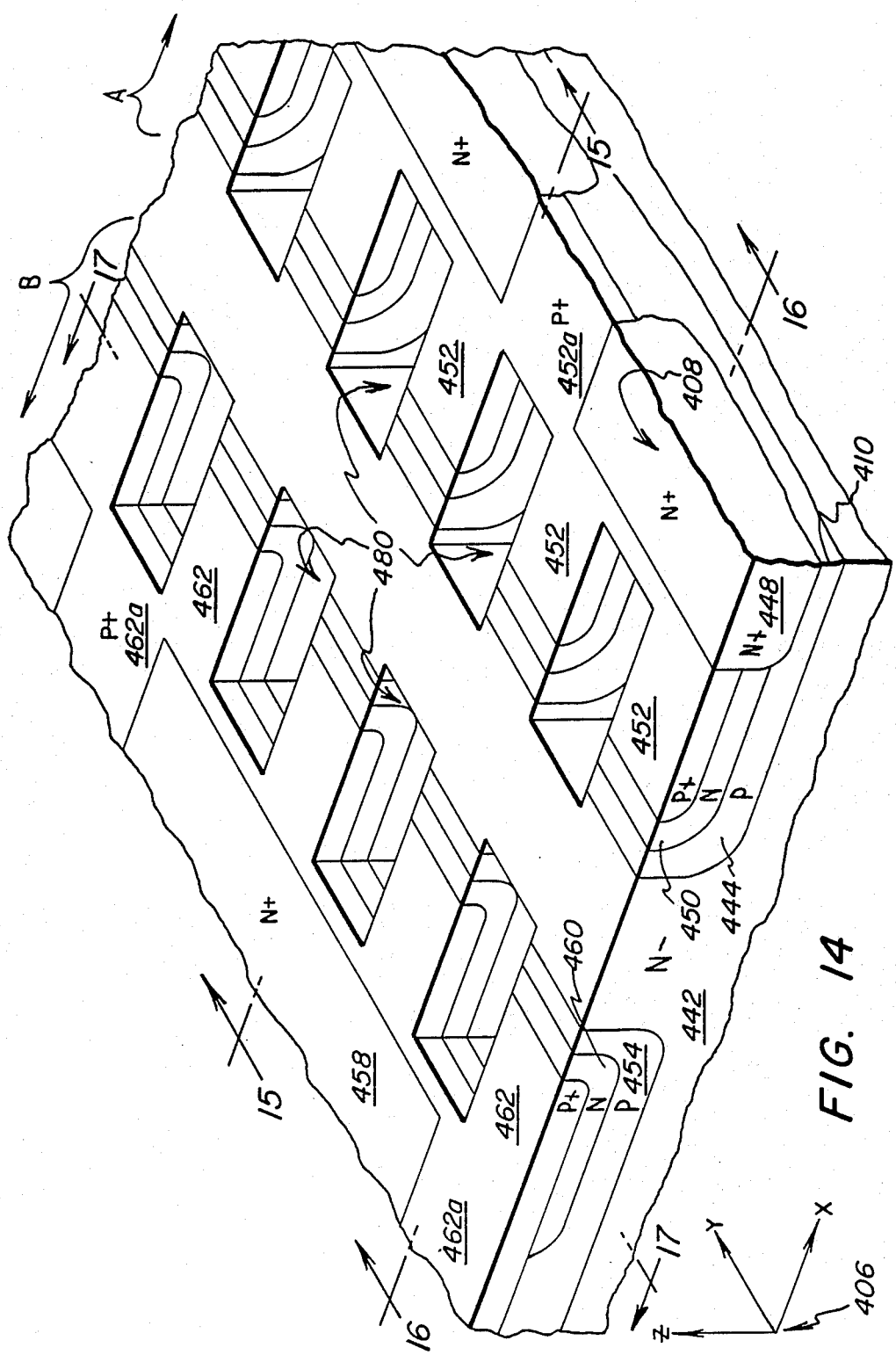
FIG. 14 is a perspective, partially cut away view of a partially-fabricated, further alternative version of the FIG. 5 device; 15-17 are cross-sectional views through a more completely fabricated device of FIG. 14 taken along the lines 15—15, 16—16 and 17—17.

A still further increase in the level of current which a device in accordance with the present invention can be assured of turning off is provided by a further alternative embodiment 400 shown partially fabricated in a perspective, partially cut away, cross-sectional view in FIG. 14 and more completely fabricated in additional cross-sectional views in FIGS. 15–17 taken along lines 15—15, 16—16 and 17—17, respectively, in FIG. 14. The device 400 is preferably similar to devices 100, 200 and 300 in having A and B structures each of which is part of two different cells. However, for clarity in the drawings only a single cell is shown in FIGS. 14–16. Device 400 is preferably fabricated through the formation of all of the doped semiconductor regions in a configuration similar to that shown in FIG. 5, i.e., with the regions 444, 450, 452, 454, 460 and 462 uniform in the Y-direction but with these regions extending further out in the X-direction from regions 448 and 458 than is the case with the corresponding regions in FIG. 5. After these regions have been formed, rather than forming the gate dielectric thereover and depositing gate electrodes as is done in the fabrication of the device 200 in FIG. 5, trenches 480 are defined along the surface 408 of the semiconductor body 410 with the length of the trenches oriented in the X-direction, i.e., parallel to the lengths of the tines in the comb structure of device 300 in FIG. 9. Trenches are formed along the righthand side of the structure through the P+ region 452, the N-type region 450 and the P-type region 444 with the trenches preferably extending into the base or drift region 442. Similarly, the trenches in the lefthand side of the structure extend through the P+ region 462, the N region 460 and the P region 454 and into the base region 442. In lateral extent, the trenches in the righthand structure preferably are spaced from the N+ regions 448 (and P+ region portion 452a) on the righthand side to allow a straight edged $M_1$ main electrode 490 to contact regions 448, portions 452a of region 452 and a portion of region 452 located between each region 448 and the trenches adjacent thereto. At their other end, the trenches may preferably extend through the P-type region 444 and into the body region 442. However, larger or smaller trenches may be used so long as a functional device results. Similarly, at the lefthand side of the structure, the trenches are preferably spaced from N+ regions 458 (and P+ region portion 462a) and may extend through the P-type region 454 into the body region 442 along the surface 408 of the semiconductor device. No particular relationship between the Y-direction period of the trenches and the Y-direction period of the N+ regions 448 is required, although one may be adopted, if desired.

After formation of the trenches 480, gate dielectric 482 is grown along the top surface between the trenches, as shown in FIGS. 15–17 and on the sides and bottoms of the trenches, as shown in FIGS. 16 and 17, and gate electrode material 484 is deposited on the top surface and within the trenches. Within the trenches gate material 484 is deposited either as a surface coating over the gate dielectric or as a complete fill of the trenches as shown. Complete filling of the trenches is preferred in order to provide a relatively planar surface for the overall device structure across which the device metallization may be disposed. Subsequently, main electrode metallizations 490 and 492 are formed along the righthand and lefthand sides of the structure in a manner similar to that in the devices 100, 200 and 300. The gate material within the individual trenches is preferably already connected from trench to trench along the upper surface of the device, as shown in FIG. 17. However, in the event that it is not already so connected, gate contacts or terminals 496 and 498 may be deposited on top of and in ohmic contact with the gate material 484 which extends into the individual trenches.

The device 400 operates on the same principles as devices 200 and 300; however, channel regions are provided everywhere where the regions 444, 450, 454 and 460 extend to the external surface of the silicon. In particular, channel regions exist along the planar part of the upper external surface as shown in FIG. 15 and along the trench walls which extend at an angle (preferably about 90°) to that portion of the surface. Thus, as is most clearly seen in the cross-sections shown in FIGS. 16 and 17, the channel regions $CP_1$, $CN_1$, $CP_2$ and $CN_2$ extend along the vertical walls of the trenches in addition to extending along the horizontal surface of the device. Thus, the channel current includes a vertical component across the P-type region 444, the N-type region 450, the P-type region 454 or the N-type region 460 (shown in FIGS. 16 and 17). The device 400 provides a substantially greater OFF channel width than the device 300 when the trenches 480 are spaced apart as closely as is feasible for fabrication purposes. A trench center-to-center spacing S along the cross-section of FIG. 17 may be as small as 3 or 4 microns with a trench width $W_T$ of $\frac{1}{2}$ to 2 microns in the Y-direction using present day fabrication techniques such as reactive ion etching (RIE) to form the trenches. This compares with a tine center-to-center spacing in the same direction in the device 300 of FIG. 9 of about 8 to 10 microns with present day fabrication techniques using 1 micron design rules.

When the bias voltage across the main electrodes $M_1$ and $M_2$ is reversed while the triac 200, 300, or 400 is ON, the effect of that reversal depends on the condition of the gates and the channels they control. If, in the absence of gate voltage, all channels are off, and no voltages are applied to the gates at the time of reversal, then the device remains in its pre-reversal state—either ON or OFF. This is because both of the "thyristors" which are inherent in the "triacs" 200, 300 and 400 share a common base region (242, 342, or 344, respectively) whose stored charge in the ON-state will hold the device ON by turning ON the other thyristor upon bias reversal.

If prior to reversal, electrode $M_2$ is at ground, $M_1$ is at a positive voltage and electrode $G_2$ is positive relative to $M_2$ to turn or keep the device ON, then upon main bias reversal the device will turn OFF because the electron conducting channel $CP_2$ created by that gate voltage (still positive relative to $M_2$) will short the P region 254 (FIG. 5) and prevent hole injection into the base once $M_2$ becomes positive relative to $M_1$.

If both electrodes $G_1$ and $G_2$ have positive voltages relative to $M_1$ and $M_2$, respectively applied to them prior to reversal of the main electrode bias voltage ($CP_1$ and $CP_2$ both conductive to electrons) so that the device is operating in an FET mode, then it will continue in an FET mode after reversal ($G_1$ positive relative to $M_1$ and $G_2$ positive relative to $M_2$) which keeps $CP_1$ and $CP_2$ conductive to electrons.

The device 100 of FIGS. 1–4 can be fabricated with serpentine channel regions as shown in FIG. 18 for device 100'. In FIG. 18, each element has the same reference numeral as the corresponding element in FIG. 1, with the exception that modified elements have had a prime (') added to their reference numeral.

This modification provides benefits for device 100 which are similar to those provided by device 300 in FIGS. 9–13 for device 200 in FIGS. 5–8.

Use of trenches in device 100 provided benefits for device 100 which are similar to those provided for device 200 by device 400 of FIGS. 14–17.

Triacs according to this invention can be turned OFF at any time under gate control as long as the ON-state current is within the device's gate control range. These devices are expected to be able to turn off any desired current level such as 10 amperes per square centimeter up to 100 amperes per square centimeter or even more. The current turn-off capacity is especially high in the trench device 400.

Many changes can be made in the illustrated embodiments without departing from the spirit and scope of this invention as defined in the appended claims. For example, the conductivity types of all the regions in any of the devices can be reversed to provide a complementary device. Other region configurations may be used which provide large OFF-gate-to-emitter width ratios to ensure gate controlled turn-off of high currents. The illustrated embodiments are all symmetrical, however, devices in accordance with this invention can also be made asymmetric. The A and B structures have been shown and described as parallel straight lines, but can have other configurations such as serpentine, concentric rings and circles, spaced apart islands and so forth.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A lateral triac comprising:
 a body of semiconductor material having a first major surface and including:
 a first region of one type conductivity extending to said first major surface;
 a second region of an opposite type conductivity extending into said first region from said first major surface;
 a third region of said one type conductivity extending into said second region from said first major surface and being spaced from said first region by said second region, said second region having a first channel region adjacent said first major surface and extending between said first and third regions;
 said second and third regions being elongated in a first direction;
 a plurality of contact portions of said second region spaced apart in said first direction and each extending through said third region to said first major surface;
 a fourth region of said opposite type conductivity extending into said first region from said first major surface and being spaced from said second region in a second direction perpendicular to said first direction by said first region;
 a fifth region of said one type conductivity extending into said fourth region from said first major surface and being spaced from said first region by said fourth region, said fourth region having a second channel region adjacent said first major surface and extending between said first and fifth regions;
 said fourth and fifth regions being elongated in said first direction;
 a plurality of contact portions of said fourth region spaced apart in said first direction and each extending through said fifth region to said first major surface;
 said first channel region having a serpentine configuration along an elongated side of said second region to provide a large channel-width-to-region-surface-area ratio for said second region;
 said second channel region having a serpentine configuration along an elongated side of said fourth region to provide a large channel-width-to-region-surface-area ratio for said fourth region;
 a first main electrode disposed in ohmic contact with said third region and said contact portions of said second region;
 a second main electrode disposed in ohmic contact with said fifth region and said contact portions of said fourth region;
 a first insulated gate electrode disposed on said first major surface in alignment with said first channel region for controlling conduction therethrough; and
 a second insulated gate electrode disposed on said first major surface in alignment with said second channel region for controlling conduction therethrough.

2. A lateral triac comprising:
 a body of semiconductor material having a first major surface and including:
 a first region of one type conductivity extending to said first major surface;
 a second region of an opposite type conductivity extending into said first region from said first major surface;
 a third region of said one type conductivity extending into said second region from said first major surface and being spaced from said first region by said second region, said second region having a first channel region adjacent said first major surface and extending between said first and third regions;
 a fourth region of said opposite type conductivity extending into said third region from said first major surface;
 said third region extending between and spacing said second and fourth regions apart at least at some locations to provide a second channel region disposed in said third region and extending between said second and fourth regions adjacent said first major surface;
 a fifth region of said opposite type conductivity extending into said first region from said first major surface and being spaced from said second region by said first region;
 a sixth region of said one type conductivity extending into said fifth region from said first major surface and being spaced from said first region by said fifth region, said fifth region having a third channel region adjacent said first major surface and extending between said first and sixth regions;
 a seventh region of said opposite type conductivity extending into said sixth region from said first major surface;
 said sixth region extending between and spacing apart said fifth and seventh regions at least at some locations to provide a fourth channel region disposed in said sixth region and extending between said fifth and seventh regions adjacent said first major surface;

a first main electrode ohmically connected to said third and fourth regions;
a second main electrode ohmically connected to said sixth and seventh regions;
a first insulated gate electrode disposed on said first major surface in alignment with said first and second channel regions for controlling conduction therethrough; and
a second insulated gate electrode disposed on said first major surface in alignment with said third and fourth channel regions for controlling conduction therethrough.

3. The lateral triac recited in claim 2, wherein:
said fourth region is everywhere spaced from said second region; and
said seventh region is everywhere spaced from said fifth region.

4. The lateral triac recited in claim 2 wherein:
said fourth region is continuous with said second region at spaced apart locations; and
said seventh region is continuous with said fifth region at spaced apart locations.

5. The lateral triac recited in claim 2 wherein:
said second and fifth regions are formed by a first diffusion step; and
said third and sixth regions are formed by a second diffusion step.

6. The lateral triac recited in claim 5 wherein said fourth and seventh regions are formed by a third diffusion step.

7. The lateral triac recited in claim 2 wherein:
said second through fourth regions are elongated in a first direction; and
said first and second channel regions have a comb-like configuration along an elongated side of said second region to provide a large channel-width-to-region-surface-area ratio for said second and third regions.

8. The lateral triac recited in claim 7 wherein:
said fifth through seventh regions are elongated in said first direction; and
said third and fourth channel regions have a comb-like structure along an elongated side of said fifth region to provide a large channel-width-to-region-surface area ratio for said fifth and sixth regions.

9. The lateral triac recited in claim 2 wherein:
said third region comprises first and second portions, said first portion being disposed between said second region and said fourth region and providing substantially uniform spacing between said second and fourth regions, said second portion of said third region having a higher dopant concentration than said first portion of said third region and extending to said first surface into contact with said first main electrode.

10. The triac recited in claim 9 wherein:
said sixth region comprises first and second portions, said first region of said sixth region being disposed between said fifth region and said seventh region and providing a substantially uniform spacing between said fifth and seventh regions, said second portion of said sixth region having a higher dopant concentration than said first portion and extending to said first surface into contact with said second main electrode.

11. The lateral triac recited in claim 9 wherein:
said triac includes trench segments extending into said body of semiconductor material to provide said first major surface with first and second portions, said first portion being substantially planar and having openings therein where said trench segments extend into said body and said second portion comprising the walls of said trench segments and extending at an angle to said first portion;
each of said second through seventh regions extends to said second portion of said surface;
said first and second gate electrodes are disposed on said second portion of said first major surface in alignment with said channel portions of said second and third regions and said fifth and sixth regions, respectively.

12. The lateral triac recited in claim 2 wherein at a selected cross-section through said device a first structure comprised of said second and third regions, said first main electrode and said first insulated gate electrode alternates in said second direction with a second structure comprised of said fourth and fifth regions, said second main electrode and said second insulated gate electrode, with said first region spacing said first and second structures apart in said second direction.

13. The lateral triac recited in claim 12 wherein:
said device includes trench segments extending into said body of semiconductor material to provide said first major surface with first and second portions, said first portion being disposed substantially parallel to a plane defined by said first and second directions and said second portion comprising the walls of said trench segments and extending at an angle to said first portion;
said second through fifth regions extending to said second portion of said first major surface; and
said first and second gate electrodes being disposed on said second portion of said first major surface in alignment with said channel regions of said second and third regions and said fourth and fifth regions, respectively.

14. The lateral triac recited in claim 13 wherein said angle is substantially a right angle.

15. A lateral triac comprising:
a body of semiconductor material having a first major surface and including:
a first region of one type conductivity extending to said first major surface;
a second region of an opposite type conductivity extending into said first region from said first major surface;
a third region of said one type conductivity extending into said second region from said first major surface and being spaced from said first region by said second region, said second region having a first channel region adjacent said first major surface and extending between said first and third regions;
a fourth region of said opposite type conductivity extending into said third region from said first major surface and at first locations in the vicinity of said first channel region being spaced from said second region by said third region, said third region having a second channel region adjacent said first major surface and extending between said second and fourth regions;
a fifth region of said one conductivity type extending from said first major surface into said body and into contact with said third region;

a sixth region of said opposite type conductivity extending into said first region from said first major surface and being spaced from said second region by said first region;

a seventh region of said one type conductivity extending into said sixth region from said first major surface and being spaced from said first region by said sixth region, said sixth region having a third channel region adjacent said first major surface and extending between said first and seventh regions;

an eighth region of said opposite type conductivity extending into said seventh region from said first major surface and at third locations in the vicinity of said third channel region being spaced from said sixth region by said seventh region, said seventh region having a fourth channel region adjacent said first major surface and extending between said sixth and eighth regions;

a ninth region of said one conductivity type extending from said first major surface into said body and into contact with said seventh region;

a first main electrode in ohmic contact with said fourth and fifth regions;

a second main electrode in ohmic contact with said eighth and ninth regions;

a first insulated gate electrode disposed on said first major surface in alignment with said first and second channel regions for controlling conduction therethrough; and a second insulated gate electrode disposed on said first major surface in alignment with said third and fourth channel regions for controlling conduction therethrough.

16. The lateral triac recited in claim 15, wherein:
at selected second locations remote from said first channel region said fourth region contacts said second region; and
at selected fourth locations remote from third channel region, said eighth region contacts said sixth region.

17. The lateral triac recited in claim 15 wherein:
said fourth region is more heavily doped than said second region;
said fifth region is more heavily doped than said third region;
said eighth region is more heavily doped than said sixth region; and
said ninth region is more heavily doped than said seventh region.

18. The lateral triac recited in claim 17 wherein:
each of said second through fourth regions, sixth through eighth regions, said first and second main electrodes and said first and second insulated gate electrodes are elongated in a first direction;
said device includes a plurality of said fifth regions which are spaced apart in said first direction; and
said device includes a plurality of said ninth regions which are spaced apart in said first direction.

19. The lateral triac recited in claim 18 wherein:
said second and third regions extend to said first major surface along both second direction sides of said first main electrode, said second direction beings perpendicular to said first direction, said first and second channel regions each being disposed on both second direction sides of said first main electrode;

said first insulated gate electrode is disposed on both second direction sides of said first main electrode;

said sixth and seventh regions extend to said first major surface along both second direction sides of said second main electrode and said third and fourth channel regions are each disposed on both second direction sides of said second main electrode; and said second insulated gate electrode is disposed on both second direction sides of said second main electrode.

20. The lateral triac recited in claim 19 wherein at a selected cross-section through said device:
a first structure comprised of said second through said fifth regions, said first main electrode and said first insulated gate electrode alternates in said second direction with a second structure comprised of said sixth through ninth regions, said second main electrode and said second insulated gate electrode, with said first region spacing said first and second structures apart in said second direction.

21. The lateral triac recited in claim 20 wherein:
said device includes a plurality of trench segments each extending into said body of semiconductor material to provide said first major surface with first and second portions, said first portion being disposed substantially parallel to a plane defined by said first and second directions and said second portion comprising the walls of said trench segments and extending at an angle to said first portion;

said second through fourth and sixth through eighth regions extending to said second portion of said first major surface; and said first and second gate electrodes being disposed on said second portion of said first major surface in alignment with said channel regions of said second and third regions and said sixth and seventh regions, respectively.

22. The lateral triac recited in claim 21 wherein said angle is substantially a right angle.

23. The semiconductor device recited in claim 2 wherein:
said fourth region has a higher net concentration of opposite conductivity type determining dopant atoms than said second region; and
said seventh region has a higher net concentration of opposite conductivity type determining dopant atoms than said fifth region.

24. The semiconductor device recited in claim 15 wherein:
said fourth region has a higher net concentration of opposite conductivity type determining dopant atoms than said second region; and
said eighth region has a higher net concentration of opposite conductivity type determining dopant atoms than said sixth region.

* * * * *